US005243231A

United States Patent [19]

Baik

[11] Patent Number: 5,243,231

[45] Date of Patent: Sep. 7, 1993

[54] SUPPLY INDEPENDENT BIAS SOURCE WITH START-UP CIRCUIT

[75] Inventor: Woo H. Baik, Seoul, Rep. of Korea

[73] Assignee: Goldstar Electron Co., Ltd., Choongchungbook, Rep. of Korea

[21] Appl. No.: 859,203

[22] Filed: Mar. 27, 1992

[30] Foreign Application Priority Data

May 13, 1991 [KR] Rep. of Korea ................ 6769/1991

[51] Int. Cl.[5] ........................................ H03K 3/01

[52] U.S. Cl. ........................... 307/296.3; 307/296.1; 307/296.4; 307/296.5; 307/296.6; 307/296.8

[58] Field of Search ............... 307/296.1, 296.2, 296.3, 307/296.4, 296.5, 296.6, 296.8, 272.3, 291, 542, 578; 323/315

[56] References Cited

U.S. PATENT DOCUMENTS 3,648,154 3/1972 Frederiksen et al. ............ 307/299.3
3,703,648 11/1972 Wrabel ............ 307/296.4
3,806,742 4/1974 Powell ............ 307/296.6
4,078,199 3/1978 Chapron et al. ............ 323/315
4,342,926 8/1982 Whatley ............ 307/296.8
4,495,425 1/1985 McKenzie ............ 307/296.8
4,683,414 7/1987 Moore ............ 320/13
4,697,111 9/1987 Van Zanten et al. ............ 307/482
4,698,531 10/1987 Jones ............ 307/272.3
4,737,669 4/1988 Austin ............ 307/592
4,769,589 9/1988 Rosenthal ............ 323/313
4,857,864 8/1989 Tanaka et al. ............ 330/288
4,961,009 10/1990 Baik ............ 307/296.8
5,083,079 1/1992 Plants ............ 307/296.8
5,087,891 2/1992 Cytera ............ 307/296.8
5,155,384 10/1992 Ruetz ............ 307/296.8

FOREIGN PATENT DOCUMENTS 0024123 2/1982 Japan ............ 307/272.3
0048830 3/1982 Japan ............ 307/272.3

*Primary Examiner*—William L. Sikes
*Assistant Examiner*—Terry Cunningham
*Attorney, Agent, or Firm*—Lowe, Price, LeBlanc & Becker

[57] ABSTRACT

A supply independent bias start-up circuit which is capable of preventing an additional current consumption which may occur therein after the start-up of a supply independent bias circuit thereof, stabilizing a bias voltage even if an input voltage from a power source is varied, and reducing a layout area thereof. The supply independent bias start-up circuit includes a supply independent bias circuit for inputting a voltage from a power source and generating a constant bias voltage, and a start-up circuit for inputting the source voltage, starting up the supply independent bias circuit at the beginning of apply of the source voltage thereto and blocking its own current loop after the source voltage enters a stabilized state. The start-up circuit is provided with a resistor having its one side connected to a power source terminal, for being applied with the source voltage, and a condenser having its one side connected to a bias voltage output node in the supply independent bias circuit, for supplying a start-up current to the supply independent bias circuit and buffering a variation of the source voltage and the bias output voltage from the supply independent bias circuit.

3 Claims, 1 Drawing Sheet

SUPPLY INDEPENDENT BIAS SOURCE WITH START-UP CIRCUIT

BACKGROUND OF THE INVENTION

1. Field of the Invention

The present invention relates in general to an improved supply independent bias start-up circuit, and more particularly to a supply independent bias start-up circuit which is capable of preventing an additional current consumption which may occur therein after the start-up of a supply independent bias circuit thereof, stabilizing a bias voltage even if an input voltage from a power source is varied, and reducing a layout area thereof.

2. Description of the Prior Art

Referring to FIG. 1, there is shown a circuit diagram of a conventional supply independent bias start-up circuit. The illustrated circuit includes a supply independent bias circuit 1 adapted to receive a voltage $V_{DD}$ from a power source and generate a constant bias voltage, and a start-up circuit 2 also receiving source voltage $V_{DD}$ and operating to start-up the supply independent bias circuit 1 upon initial application of the source voltage $V_{DD}$ thereto.

The supply independent bias circuit 1 includes a pair of PMOS transistors PM1 and PM2 including source terminals connected to a power source terminal and gate terminals connected to each other, for inputting the voltage $V_{DD}$ from the power source, an NMOS transistor NM2 including a drain terminal connected in common to the gate terminals of the PMOS transistors PM1 and PM2 and a drain terminal of the PMOS transistor PM2 and its source terminal connected to a ground terminal GND through a resistor R1, for forming a bypass current loop of the circuit, and an NMOS transistor NM1 including a gate terminal and drain terminal connected in common to a drain terminal of the PMOS transistor PM1 and a gate terminal of the NMOS transistor NM2 and its source terminal connected to the ground terminal GND, for supplying the bias voltage through its drain common connection node n1 with the PMOS transistor PM1.

The start-up circuit 2 is provided with a resistor R2 having one end connected to the power source terminal, for receiving the source voltage $V_{DD}$, an NMOS transistor NM4 including a drain terminal and gate terminal connected to the other end of resistor R2 and a source terminal connected to the ground terminal, for functioning as a bypass current source, and an NMOS transistor NM3 including a gate terminal connected to a common connection of the drain terminal and gate terminal of the NMOS transistor NM4, a source terminal connected to the ground terminal GND and a drain terminal connected to a common connection of the drain terminal of the NMOS transistor NM2 with the gate terminals of the PMOS transistors PM1 and PM2 in the supply independent bias circuit 1, for forming the bypass current loop of the circuit to start-up the supply independent bias circuit 1 at the beginning of application of the source voltage $V_{DD}$ thereto.

The operation of the conventional supply independent bias start-up circuit with the above-mentioned construction will now be described.

It is noted that two varieties of voltage may appear at the drain common connection node n1 of the PMOS transistor PM1 and NMOS transistor NM1 in the supply independent bias circuit 1. Namely, the voltage being applied to the node n1 is the bias voltage to be obtained or OV. In case where the supply independent bias circuit 1 is not operational upon application of the source voltage $V_{DD}$ to the circuit, only the circuit itself cannot form the current loop. As a result, under this condition, the bias voltage output node n1, or the drain common connection node n1 of the PMOS transistor PM1 and the NMOS transistor NM1 is applied with the bias voltage of zero voltage.

Therefore, there is a necessity for starting-up the supply independent bias circuit 1 utilizing the start-up circuit 2. First, upon application of the source voltage $V_{DD}$ of transient state to the circuit, the source voltage $V_{DD}$ is applied to the gate terminals of the NMOS transistors NM3 and NM4 through the resistor R2 in the start-up circuit 2, thereby causing the NMOS transistor NM3 to be instantaneously turned on. As a result of the turn-on of the NMOS transistor NM3 in the start-up circuit 2, the common connection of the drain terminals of the PMOS transistor PM2 and NMOS transistor NM2 with the gate terminals of the PMOS transistors PM1 and PM2 in the supply independent bias circuit 1 is connected to the ground terminal GND, resulting in the forming of the bypass current loop. As a result, the ground voltage is applied to the gate terminals of the PMOS transistors PM1 and PM2, resulting in turning-on of the devices.

Then, the source voltage $V_{DD}$ is applied to the gate terminals of the NMOS transistors NM1 and NM2 through the turned-on PMOS transistor PM1, resulting in turning-on of the devices. As a result, the source voltage $V_{DD}$ is divided by a conductance value of the PMOS transistor PM1 and NMOS transistor NM1, thereby causing the bias voltage to be generated at the node n1.

Then, at that time that the source voltage $V_{DD}$ enters a stabilized state after passing through the initial transient state, the source voltage $V_{DD}$ is applied to the gate terminal of the NMOS transistor NM4 through the resistor R2, resulting in turning-on of the device. As a result, since the source voltage $V_{DD}$ through the resistor R2 is bypassed to the ground terminal GND through the turned-on NMOS transistor NM4, a low voltage is thus applied to the gate terminal of the NMOS transistor NM3, resulting in turning-off of the device. The start-up circuit 2 ceases to start-up the supply independent bias circuit 1 due to NMOS transistor NM3 thereof turning off. Namely, the forming of the bypass current loop by the NMOS transistor NM3 in the start-up circuit 2 is no longer enabled. As a result, the supply independent bias circuit 1 stably generates the bias voltage, with maintaining the current loop by itself.

However, the conventional supply independent bias start-up circuit has a disadvantage, in that the NMOS transistor NM4 in the start-up circuit 2 is at its turn-on state even after the source voltage $V_{DD}$ enters the stabilized state. The turn-on of the NMOS transistor NM4 under this condition causes a flow of current IS therethrough, in spite of a larger current consumption. Moreover, as the source voltage $V_{DD}$ is varied, the current is varied in amount, resulting in an influence on the bias voltage of the supply independent bias circuit 1. In other words, in a case where an operating range of the source voltage $V_{DD}$ is wide, a variation may occur in the bias voltage.

SUMMARY OF THE INVENTION

Therefore, it is an object of the present invention to provide a supply independent bias start-up circuit which is capable of preventing an additional current consumption which may occur therein after the start-up of a supply independent bias circuit thereof, stabilizing a bias voltage even if an input voltage from a power source is varied, and reducing a layout area thereof.

In accordance with the present invention, the above object can be accomplished by providing a supply independent bias start-up circuit including supply independent bias means adapted for inputting a voltage from a power source and generating a constant bias voltage, and start-up means adapted for inputting the source voltage, starting up the supply independent bias means at the beginning of apply of the source voltage thereto and blocking its own current loop after the source voltage enters a stabilized state.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
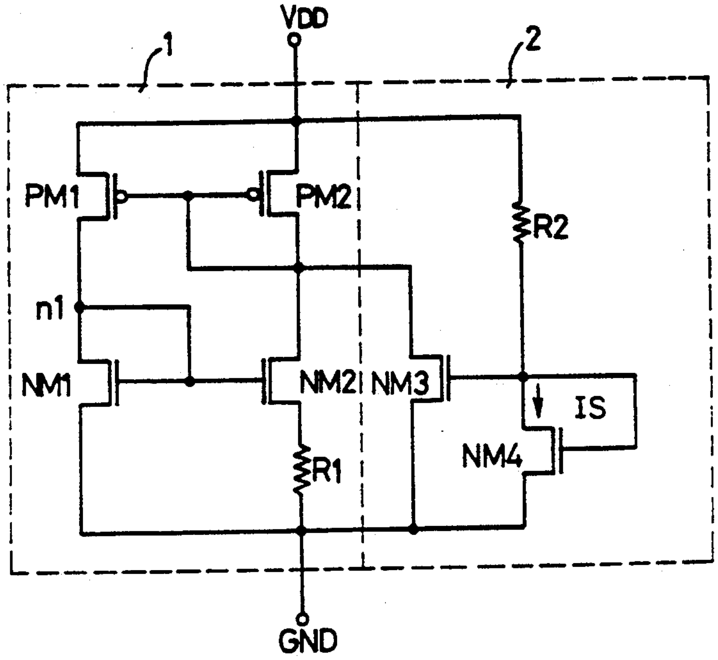
F I G. 1 PRIOR ART
FIG. 1 is a circuit diagram of a conventional supply independent bias start-up circuit.
Figure 2:
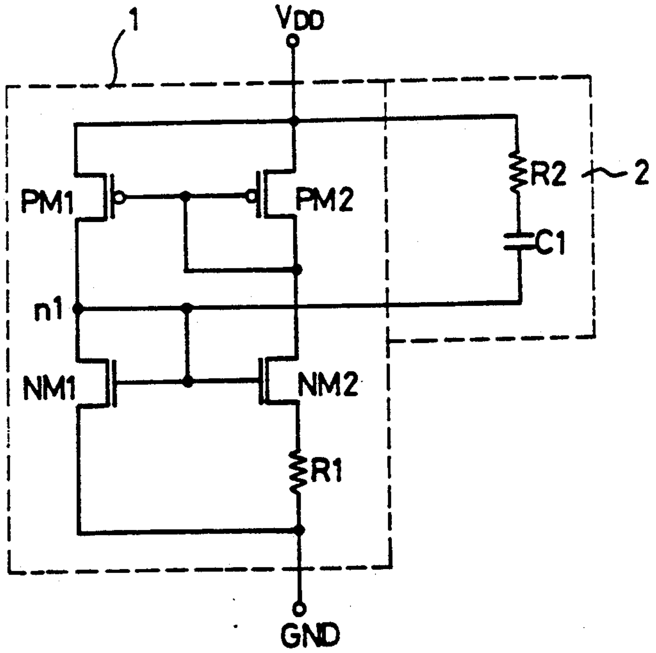
FIG. 2 is a circuit diagram of a supply independent bias start-up circuit of the present invention.

Referring to FIG. 2, there is shown a circuit diagram of a supply independent bias start-up circuit of the present invention. As shown in this drawing, the circuit of the present invention includes a supply independent bias circuit 1 adapted to input a voltage $V_{DD}$ from a power source and generate a constant bias voltage, and a start-up circuit 2 adapted to input the source voltage $V_{DD}$ and start up the supply independent bias circuit 1 at the beginning of apply of the source voltage $V_{DD}$ thereto.

The supply independent bias circuit 1 is provided with a pair of PMOS transistors PM1 and PM2 including source terminals connected to a power source terminal and gate terminals connected to each other, for receiving the voltage $V_{DD}$ from the power source, a NMOS transistor NM2 including drain terminal connected in common to the gate terminals of the PMOS transistors PM1 and PM2 and a drain terminal of the PMOS transistor PM2, and further including a source terminal connected to a ground terminal GND through a resistor R1, for forming a bypass current loop of the circuit, and an NMOS transistor NM1 including a gate terminal and drain terminal commonly connected to a drain terminal of the PMOS transistor PM1 and a gate terminal of the NMOS transistor NM2 and a source terminal connected to the ground terminal GND, for supplying the bias voltage through its drain common connection node n1 with the PMOS transistor PM1.

The start-up circuit 2 includes a resistor R2 having one end connected to the power source terminal, for receiving the source voltage $V_{DD}$, and a condenser C1 having one end connected to the other end of the resistor R2 and its other end connected to the bias voltage output node n1, or the drain common connection node n1 of the PMOS transistor PM1 and NMOS transistor NM1 in the supply independent bias circuit 1, for supplying a start-up current to the supply independent bias circuit 1 and filtering variations of the source voltage $V_{DD}$ from being supplied to the bias output.

Now, the operation of the supply independent bias start-up circuit with the above-mentioned construction in accordance with the present invention will be described in detail.

First, upon initial application of the source voltage $V_{DD}$ of transient state to the circuit, the source voltage $V_{DD}$ is supplied simultaneously to the supply independent bias circuit 1 and the start-up circuit 2. The source voltage $V_{DD}$ applied to the start-up circuit 2 is filtered by the resistor R2 and the condenser C1 and then the filtered voltage is applied to the bias voltage output node n1 in the supply independent bias circuit 1. In other words, at the beginning of application of the source voltage, a high voltage through the resistor R2 and the condenser C1 in the start-up circuit 2 is applied to the gate terminals of the NMOS transistors NM1 and NM2 in the supply independent bias circuit 1 for a short time, resulting in turning-on of the devices.

As a result of the turning-on of the NMOS transistors NM1 and NM2, the gate terminals of the PMOS transistors PM1 and PM2 are connected to the ground terminal GND through the NMOS transistor NM2 and the resistor R1, resulting in the forming of the bypass current loop. As a result, the ground voltage is applied to the gate terminals of the PMOS transistors PM1 and PM2, resulting in turning-on of the devices. Then, the source voltage $V_{DD}$ is applied to the gate terminals of the NMOS transistors NM1 and NM2 through the turned-on PMOS transistors PM1 and PM2 and is also bypassed to the ground terminal GND through the NMOS transistors NM1 and NM2 and the resistor R1. As a result, the source voltage $V_{DD}$ is divided by a conductance value of the PMOS transistor PM1 and NMOS transistor NM1, thereby causing the bias voltage to be generated at the node n1.

Then, at that time that the source voltage $V_{DD}$ enters a stabilized state after passing through the initial transient state, the source voltage $V_{DD}$ is applied to the one side of the condenser C1 through the resistor R2 in the start-up circuit 2 and also to the other side of the condenser C1 through the PMOS transistor PM1 in the supply independent bias circuit 1. As a result, the current loop through the condenser C1 is blocked due to no potential difference across the condenser C1. That is, the current loop of the start-up circuit 2 is blocked by the condenser C1 after the source voltage $V_{DD}$ enters the stabilized state, resulting in no further current consumption of the circuit. In result, the supply independent bias circuit 1 generates stably the bias voltage, with maintaining the current loop by itself without the start-up voltage from the start-up circuit 2.

Also, since the current loop of the start-up circuit 2 is blocked by the condenser C1 after the source voltage $V_{DD}$ enters the stabilized state, the start-up circuit 2 has no effect on the bias voltage. It makes the circuit available even if an operating range of the source voltage $V_{Dd}$ is wide.

On the other hand, in a case where an abrupt variation occurs in the source voltage $V_{DD}$ due to a noise, a potential difference is generated across the condenser C1 since the source voltage $V_{DD}$ is applied to the one side of the condenser C1 through the resistor R2 in the start-up circuit 2 and also to the other side of the condenser C1 through the PMOS transistor PM1 in the supply independent bias circuit 1. This potential difference causes the charging/discharging operations of the condenser C1, thereby preventing variation in the level of the bias voltage. Namely, the bias voltage is stabilized even if the source voltage is varied.

As hereinbefore described, in accordance with the present invention, there is provided a supply independent bias start-up circuit which is capable of preventing an additional current consumption which may occur therein after the source voltage enters the stabilized state, utilizing the condenser in the start-up circuit thereof. Also, since the current loop of the start-up circuit is blocked by the condenser after the source voltage enters the stabilized state, the start-up circuit has no effect on the bias voltage. It makes the circuit available even if an operating range of the source voltage is wide. Moreover, even in case where an abrupt variation occurs in the source voltage due to a noise, the bias voltage in the supply independent bias circuit can be stabilized by the condenser. Further, utilizing the condenser reduces a layout area of the circuit.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A bias supply, comprising:

supply independent bias means for receiving a voltage from a voltage source and supplying a constant bias voltage; and start-up means for receiving the source voltage, starting up said supply independent bias means upon initial application of the source voltage thereto and inhibiting current flow through said start-up means after the source voltage attains a substantially stabilized state, wherein said start-up means includes:

a resistor having one terminal connected to a voltage source terminal for receiving the source voltage, and a capacitor having one terminal connected to the other terminal of said resistor and another terminal connected to a bias voltage output node of said supply independent bias means for supplying a start-up current to said supply independent bias means and filtering variations of the source voltage from being supplied to the bias means output.

2. A start-up circuit for use with a supply independent bias means which receives a source voltage from a power source for supplying a bias voltage, said start-up circuit comprising:

(i) a resistor having one terminal connected to said power source for receiving said source voltage; and (ii) a capacitor having one terminal connected to the other terminal of said resistor, the other terminal of said capacitor connected to a bias voltage output node of said supply independent bias means for supplying a start-up current to said supply independent bias means and filtering variations of the source voltage from being supplied to the bias means output.

3. A bias supply, comprising:

supply independent bias means for receiving a voltage from a voltage source and supplying a constant bias voltage; and start-up means for receiving the source voltage, starting up said supply independent bias means upon initial application of the source voltage thereto and inhibiting substantially all current flow through all portions of said start-up means after the source voltage attains a substantially stabilized state, wherein said start-up means comprises a series connection of a resistor and a capacitor.

* * * * *